United States Patent
McConville et al.

(10) Patent No.: US 9,648,752 B2
(45) Date of Patent: May 9, 2017

(54) SOLID INK MASK REMOVAL PROCESS

(71) Applicant: Xerox Corporation, Norwalk, CT (US)

(72) Inventors: Paul McConville, Webster, NY (US);
Jeffrey J. Folkins, Fairport, NY (US);
James R. Larson, Fairport, NY (US);
Alexander J. Fioravanti, Penfield, NY (US)

(73) Assignee: XEROX CORPORATION, Norwalk, CT (US)

( * ) Notice: Subject to any disclaimer, the term of this patent is extended or adjusted under 35 U.S.C. 154(b) by 59 days.

(21) Appl. No.: 14/684,746

(22) Filed: Apr. 13, 2015

(65) Prior Publication Data

US 2016/0302310 A1 Oct. 13, 2016

(51) Int. Cl.
| | |
|---|---|
| *H05K 3/00* | (2006.01) |
| *B08B 1/00* | (2006.01) |
| *B08B 3/00* | (2006.01) |
| *H05K 3/06* | (2006.01) |
| *B08B 7/02* | (2006.01) |
| *C09D 9/00* | (2006.01) |
| *B08B 1/02* | (2006.01) |
| *B08B 1/04* | (2006.01) |
| *B08B 3/04* | (2006.01) |
| *B08B 3/12* | (2006.01) |

(52) U.S. Cl.
CPC ............. *H05K 3/061* (2013.01); *B08B 7/02* (2013.01); *C09D 9/00* (2013.01); *B08B 1/02* (2013.01); *B08B 1/04* (2013.01); *B08B 3/041* (2013.01); *B08B 3/123* (2013.01); *H05K 2201/0329* (2013.01); *H05K 2203/013* (2013.01); *H05K 2203/0746* (2013.01); *H05K 2203/0783* (2013.01); *H05K 2203/081* (2013.01); *H05K 2203/1545* (2013.01)

(58) Field of Classification Search
None
See application file for complete search history.

(56) References Cited

U.S. PATENT DOCUMENTS

| | | | | |
|---|---|---|---|---|
| 3,764,587 | A * | 10/1973 | Zunker | C08F 220/18 525/176 |
| 4,925,705 | A * | 5/1990 | Hill | H05K 3/048 216/13 |
| 5,011,708 | A * | 4/1991 | Kelly | A61L 2/232 204/192.15 |
| 5,460,767 | A * | 10/1995 | Sanftleben | B29C 39/021 156/155 |
| 5,919,545 | A * | 7/1999 | Giezendanner | B29C 53/04 156/196 |
| 6,379,569 | B1 * | 4/2002 | Rouberol | C03C 17/23 134/902 |
| 8,628,679 | B2 * | 1/2014 | DeSanto | B32B 37/025 216/91 |
| 8,628,818 | B1 * | 1/2014 | Sharma | H05K 1/09 29/592 |
| 2003/0008156 | A1 * | 1/2003 | Pocius | C09D 5/4434 428/457 |

(Continued)

*Primary Examiner* — Allan Olsen
(74) *Attorney, Agent, or Firm* — Fay Sharpe LLP

(57) ABSTRACT

A process and device for removing a solid ink mask printed onto a substrate is disclosed. The substrate is bent around a bar set perpendicular to the substrate, causing the mask to flake off the substrate. The process permits fast removal of solid ink masks.

16 Claims, 3 Drawing Sheets

(56) References Cited

U.S. PATENT DOCUMENTS

| | | | | |
|---|---|---|---|---|
| 2003/0067094 A1* | 4/2003 | Dempsey | B29B 13/021 | 264/321 |
| 2005/0079200 A1* | 4/2005 | Rathenow | A61L 27/303 | 424/423 |
| 2006/0139395 A1* | 6/2006 | Nakashima | B41J 13/0018 | 347/22 |
| 2006/0182984 A1* | 8/2006 | Abele | B32B 27/08 | 428/500 |
| 2006/0257754 A1* | 11/2006 | Harubayashi | G03F 1/62 | 430/5 |
| 2007/0259606 A1* | 11/2007 | Williams | B24C 1/04 | 451/31 |
| 2009/0266788 A1* | 10/2009 | Chang | H05K 3/061 | 216/17 |
| 2011/0070448 A1* | 3/2011 | Matsumura | B29C 53/04 | 428/412 |
| 2011/0207328 A1* | 8/2011 | Speakman | H01L 51/0016 | 438/694 |
| 2013/0299449 A1* | 11/2013 | Ketelaars | C09D 5/008 | 216/13 |

* cited by examiner

SOLID INK MASK REMOVAL PROCESS

BACKGROUND

The present disclosure relates to processes and devices for removing solid ink masks. These inks are employed in the manufacture of plastic films with a functional design. For example, a primary application for such inks is the manufacture of circuit boards, and the inks can be applied via printing onto the substrate in the desired pattern.

Printed circuit boards (PCBs) connect and interface electronic components together in addition to other elements in computers, consumer electronics, and automated manufacturing and inspection equipment. PCBs may be produced from a base substrate, typically an insulating material, on which a thin metallic layer, usually copper, is laminated or plated. Chemical etching is then used to remove areas of the metallic layer so as to produce electrically conducting paths or traces. These paths permit electrical interconnectivity between components attached to the PCB. It would be desirable to design processes for chemical etching of substrates that are compatible with solid inks and removal of solid inks, particularly those that make manufacturing processes easier and more efficient.

BRIEF DESCRIPTION

Disclosed in various embodiments are processes for removing solid ink masks from a flexible substrate. The substrate, with the solid ink mask applied to one side of the substrate, is pulled with the opposite side of the substrate over a bar with a tight radius to cause the ink mask to flake off of the substrate.

The bar may have a minimum radius of curvature of about 0.1 mm to about 100 mm, preferably from about 1 mm to about 10 mm. The bar may be cylindrical in shape, or generally has an edge with a minimum radius of curvature of about 0.1 mm to about 100 mm, preferably from 1 mm to about 10 mm.

The substrate may be, but is not limited to, polyacetylene, polyphenylene vinylene; polypyrrole, or polythiophene, or polyaniline, or polyphenylene sulfide or conductive derivatives of such films. Poly(3,4-ethylenedioxythiophene) polystyrene sulfonate (PEDOT-PSS) is a preferred conductive film that is used as a substrate for the ink mask. The solid ink mask may have a thickness of about 1 to about 1000 microns with a preferred thickness of about 10 microns to about 150 microns. The optimum thickness of the solid ink mask is a function of the properties of the solid ink and the thickness of the substrate. The bar is usually oriented perpendicularly to a process direction of the substrate.

The process can further comprise abrading the solid ink mask with air jets, water or solvent fluid jets, spinning brushes, or combinations thereof. These abrading techniques are used during the bending operation. The process may further comprise removing any residual ink on the film with a solvent. In particular embodiments, the solvent is toluene. The residual ink can be washed using a physical medium containing the solvent.

Generally, the solid ink flakes washed off the substrate are collected and disposed of using water or air. The water or air may then be filtered to remove any flakes. Alternatively the solid ink flakes are removed by a sticky roll or a sticky film. The sticky film could be used at the point where the solid ink mask is flaked off or could be further downstream from that point.

Also disclosed are processes for making a flexible conductive circuit, comprising: applying a solid ink mask to a flexible conductive film in a desired pattern; exposing the uncovered parts of the film to an etchant to form the conductive circuit; and removing the solid ink mask by pulling the film over a bar with a tight radius to cause the ink mask to flake off of the conductive film.

In some embodiments, the process further comprises removing residual ink by contacting the conductive film with at least one secondary roller carrying a solvent.

The conductive film may be poly(3,4-ethylenedioxythiophene polystyrene sulfonate). The etchant may be an oxidizing agent such as sodium hypochlorite or hydrogen peroxide solutions.

If desired, multiple bars with a tight radius may be present, with the film/substrate being pulled over each bar in succession.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
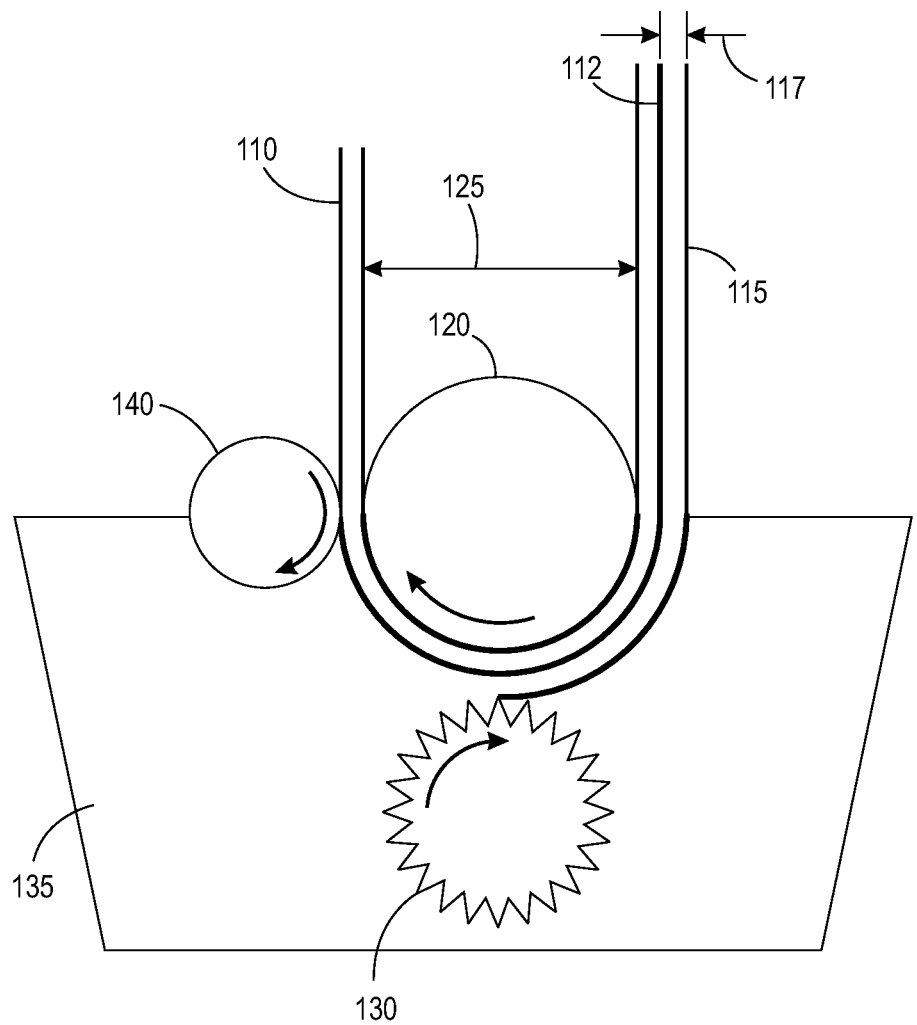
FIG. 1 is a schematic diagram of an exemplary embodiment of the process.

A more complete understanding of the components, processes and apparatuses disclosed herein can be obtained by reference to the accompanying drawings. These figures are merely schematic representations based on convenience and the ease of demonstrating the present disclosure, and are, therefore not intended to indicate relative size and dimension of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The term "room temperature" refers to a temperature of about 23 degrees Celsius.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4." The term "about" may refer to plus or minus 10% of the indicated number.

The use of the singular terms "a", "an", and "the" should be construed to include plural referents as well, unless clearly indicated otherwise by the context. Put another way, these singular terms should be construed as "at least one."

The term "layer" means a single continuous sheet of material covering a surface.

"Chemical etching" is defined to mean any chemical process that reduces the conductivity of the exposed area to a level low enough that the conductivity difference between the exposed and non-exposed areas is sufficient to make the film effective for the given application. Etching can be achieved by either removing the conductive film in desired areas or by chemically modifying the film in desired areas to cause it to be sufficiently non-conductive for the intended application.

The present disclosure relates to the use of solid ink as a mask on selected portions of a flexible substrate. The ink mask can be used to protect the covered portions of the substrate against a change in property, or against addition of layers on top of that covered area. For example, the ink mask could be applied to protect against a change in color, surface energy, or roughness of the covered portions, or to permit the deposition of a new layer of material (e.g. paint, silicone, insulation, etc.) upon only the uncovered portions of the substrate. In particular, the solid ink mask can be used for making conductive circuits/pathways on a conductive film, and the subsequent removal of the solid ink mask. In this regard, a solid ink is solid at room temperature, and is generally applied to the substrate at elevated temperatures. Such inks can be referred to as solid inks, hot melt inks, or phase change inks. Solid inks are usually formed from a blend of polymeric resins with waxes and pigments/dyes. In the present disclosure though, pigments/dyes do not need to be present, as the color of the solid ink is not required for the processes of the present disclosure.

Solid ink can be used as a mask material for making conductive circuits/pathways. Inkjet printing in particular allows for the application of a high resolution mask for high resolution circuitry. The solid ink may be applied over the surface of a substrate in a desired pattern to protect certain areas of the substrate from being exposed, while permitting the uncovered areas to be exposed.

Solid ink can also be used as a mask on a flexible conductive film. Conductive films are lower cost alternatives to indium tin oxide (ITO) films and can further enable invisible electronics (e.g., transparent circuits for new devices in printable electronics and projective capacitive sensors) and flexible form factors (e.g., flexible designs with disruptive touch features in bendable, conformable devices).

Solid ink masks may be patterned and used to protect printed electronics on flexible conductive films such as poly(3,4-ethylenedioxythiophene polystyrene sulfonate) (PEDOT-PSS). PEDOT-PSS is a conductive film that can be rendered non-conductive by treatment with a sodium hypochlorite solution (i.e. etching). The solid ink mask protects the PEDOT-PSS film, enabling the digital design of printed electronics. The solid ink mask is digitally rendered and printed by inkjet printer onto the conductive film in the desired pattern.

Past and presently applied removal processes employ solvents to remove the solid ink, taking significant time to do so. In the present disclosure, one promising direction is to physically peel or flake the solid ink off, which takes less time, and then removing any residual flakes by either streams of water or air or mechanically with brushes or sticky surfaces. This approach simplifies and improves performance over previous methods, improving efficiency while reducing costs.

FIG. 1 illustrates an exemplary embodiment of a solid ink mask removal process. As illustrated here, the removal process is applied to a flexible conductive film having a surface upon which the solid ink mask is applied in the desired pattern. Not shown here is the solid ink mask being applied to the conductive film, which can be, for example, PEDOT-PSS. Also not shown here is the sodium hypochlorite being applied to the PEDOT-PSS conductive film to render the exposed parts of the film non-conductive (i.e. the solid ink mask covers the conductive traces). It is noted that the conductive film itself may be applied upon a flexible base substrate before the solid ink mask is applied. In other words, the substrate or film can be made up of multiple layers.

The flexible conductive film 110 is seen here in a vertical orientation traveling downwards on the right-hand side of FIG. 1. The flexible conductive film is pulled against a bar 120 with a tight radius 125. In other words, the bar has a curved edge with a radius of curvature of about 0.1 mm to about 100 mm, including from about 1 mm to about 10 mm, and in more particular embodiments the bar has a radius of about 3 mm. The solid ink mask 115 is present on the surface 112 of the film that does not contact the bar 120. The bar is illustrated here as a primary roller with a cylindrical shape. As illustrated here, the roller also rotates to move the film along its path, if desired. It is noted that the bar does not have to have a cylindrical shape, just a curved edge. For example, a stationary bar having the cross-section of a square with rounded corners could be used as well.

A small radius for the bar 120 is preferred, but a radius too small will result in film deformation. The radius to be used may depend upon the amount of ink originally laid down, process conditions, and the conductive film surface itself. The substrate/conductive film itself need not be made of any particular material or have any particular properties. The required bar curvature is related to the film thickness where the thicker the film is, the larger the radius of curvature can be, and the thinner the solid ink mask can be to be effective.

The thickness 117 of the solid ink mask is important. Thin masks peel poorly. Thicker layers are preferred. In one embodiment, each individual layer may be about 15 microns to about 150 microns thick. In preferred embodiments, the mask has a thickness of six layers, each layer having a thickness of about 14 microns. In other embodiments, the mask has a thickness of at least 80 microns. The solid ink can be any suitable ink. If the solid ink mask is too thick, it may be (unintentionally) too robust and the flaking-off action described above will be compromised.

As the film runs over the bar, the solid ink mask will flake off. In this vertical orientation, the mask flakes can fall away from the film. However, the conductive film 110 can pass the bar 120 in any orientation for peeling.

As the film traverses the bar 120, the solid ink mask can also be abraded with additional ink removal mechanisms. As depicted here, a spinning brush 130 located beneath the bar 120 can come into physical contact with the solid ink mask while the mask is being flaked, enhancing flake removal. The spinning brush 130 may be either dry or wet, as desired. Alternatively, the solid ink mask/ink flakes can be abraded with air jets, or water or solvent fluid jets, other mechanical agitators, or combinations thereof. As another alternative, the flakes can be removed with the aid of a sticky roll or belt that the flakes adhere to and pulls them away from the film/substrate. A catch basin 135 is present beneath the bar 120 and the spinning brush 130, to collect the ink flakes and any water/solvent. The solid ink flakes are then disposed of using streams of water or air. The water or air can be filtered to remove any flakes.

After the solid ink flakes are removed, there may still be some residual ink or ink chemical components left on the film. That residual can be removed using a solvent, either by simply soaking the film therein or with the help of some mechanical wiping or agitation or ultrasonics, etc. For example, as illustrated here, secondary roller 140 includes a cloth that is impregnated with solvent to wipe the conductive film clean.

Any residue can be rapidly removed with solvent. Suitable solvents include isobutyl acetate, isobutyl alcohol, isobutyl isobutyrate, methyl n-propyl ketone, toluene, xylene, mesitylene, ethylbenzene, diethylbenzene, trimethyl benzene, methyl ethyl benzene, tetrahydronaphthalene, chlorobenzene, dichlorobenzene, trichlorobenzene, chlorotoluene, methyl isobutyl ketone, methyl benzoate, benzyl benzoate, anisole, cyclohexanone, acetophenone, and the like, or mixtures thereof. Plant-based "bio solvents" may also be used, which can be safer and more environmentally friendly than toluene, e.g., Bio-Solv™, which is an ethyl lactate blend (distributed under license from Phoenix Resins, Inc.).

The present system permits faster removal of solid ink masks compared to removal via solvent washing alone. Additionally, if the majority of the ink can be removed before a final solvent cleaning, the entire process will consume significantly less solvent.

The arrow inside bar 120 indicates the process direction. It is noted that if the solid ink mask was applied using an inkjet printer, or the substrate has any corrugation ribbing, the substrate should be oriented so that the substrate is traveling and bending in the same direction of the printing/ribbing. Especially with corrugated substrates, the solid ink mask will flake off more efficiently if the bending motion of the bar is in the direction of the ribbing lines rather than against it. In other words, the corrugated ribbing lines are parallel to the process direction.

Figure 2:
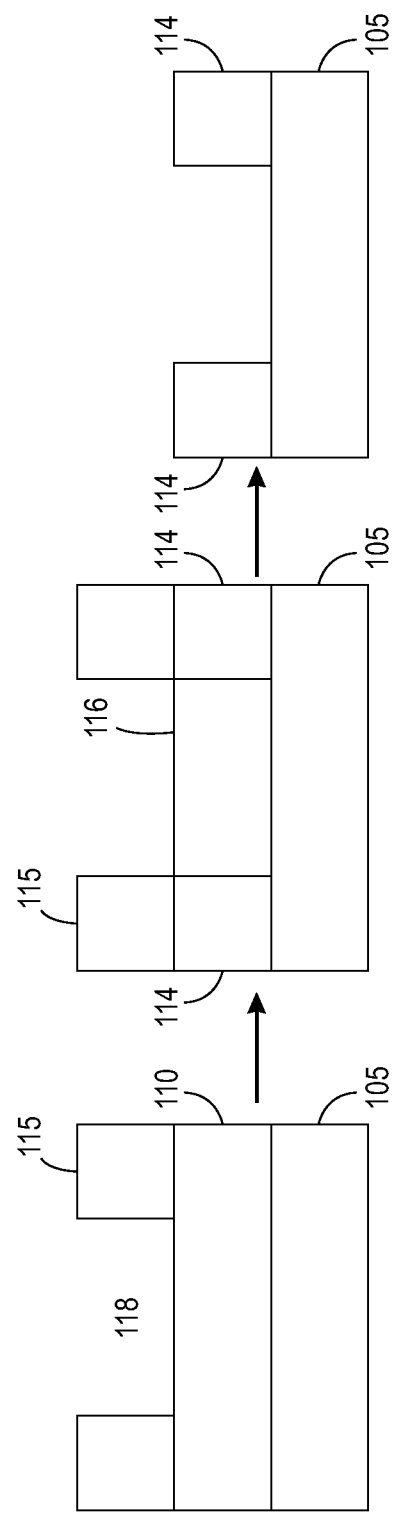
FIG. 2 is a cross-sectional view of the process.

FIG. 2 illustrates the process and the resulting changes to the conductive film. As seen in the left-most picture, there is a substrate 105 upon which a conductive film 110 is laid. A solid ink mask 115 is present in a desired pattern upon the conductive film, leaving exposed areas indicated by reference numeral 118. As indicated in the middle picture, after exposure to sodium hypochlorite, the conductive film contains conductive areas 114 and non-conductive areas 116. Then, in the right-most picture, the solid ink mask has been removed by flaking to expose the conductive areas 114. In most applications, there will be a support substrate upon which a functional coating is applied. The solid ink mask is used to cover selected portions of the functional coating.

Figure 3:
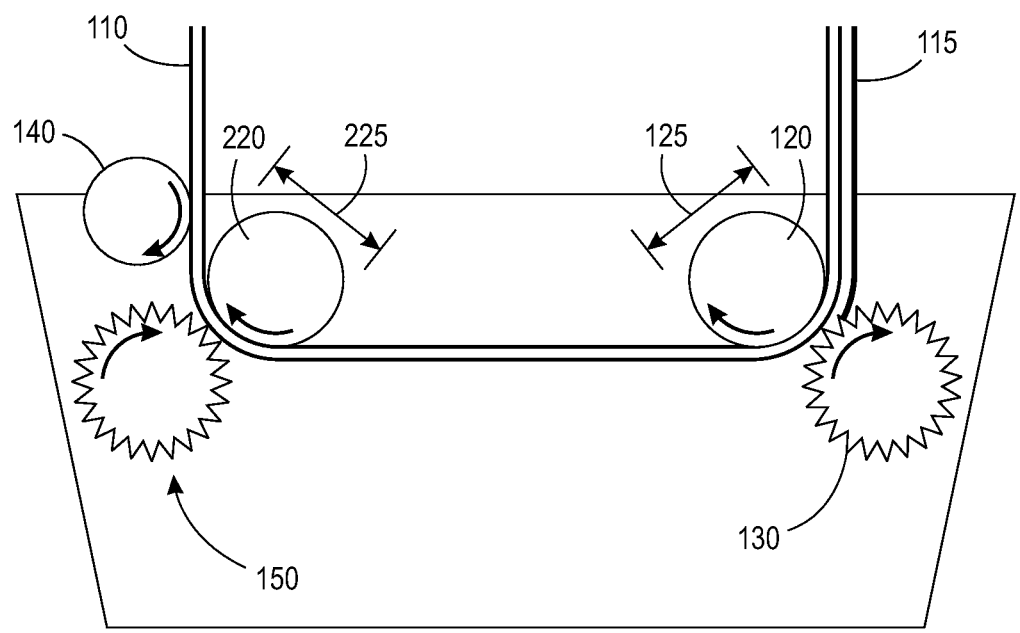
FIG. 3 is a schematic diagram illustrating an embodiment of the process involving multiple sequential stages of bending.

FIG. 3 illustrates one variation of the general concept. Multiple sequential stages of bending can be implemented as well. As illustrated here, the film 110 has a solid ink mask 115. The film is pulled over bar 120 having a tight radius 125. A spinning brush 130 also abrades the solid ink mask 115. The film then travels over second bar 220 having a tight radius 225, and is abraded by another spinning brush 150. The film then passes by secondary roller 140, which wipes any residual ink off of the film 110. It is not required that the bar with the right radius be perpendicular to the process direction. Thus, three or more passes could be implemented by bending of the film in three dimensions.

The present disclosure has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A process for removing a solid ink mask from a flexible substrate, comprising:
    pulling the substrate over a bar to cause the ink mask to flake off of the substrate, wherein the bar has a radius of curvature of about 0.1 mm to about 100 mm; and,
    abrading the solid ink mask with air jets, water or solvent fluid jets, spinning brushes, or combinations thereof.

2. The process of claim 1, wherein the bar is cylindrical and rotates with the substrate.

3. The process of claim 1, wherein the substrate is poly(3,4-ethylenedioxythiophene-polystyrene sulfonate).

4. The process of claim 1, wherein the mask has a thickness of about 1 micron to about 1000 microns.

5. The process of claim 1, wherein the bar is oriented perpendicularly to a process direction of the substrate.

6. The process of claim 1, further comprising removing any residual ink on the substrate with a solvent.

7. The process of claim 6, wherein the solvent is toluene.

8. The process of claim 6, wherein the residual ink is washed using a physical medium containing the solvent.

9. The process of claim 1, wherein the solid ink flakes are collected and disposed of using water or air, or by using a sticky surface.

10. The process of claim 9, wherein the water or air is filtered to remove any flakes.

11. The process of claim 1, wherein the flexible substrate has corrugated ribbing lines, and the ribbing lines are parallel to a process direction in which the substrate is pulled over the bar.

12. A process for making a flexible conductive circuit, comprising:
    applying a solid ink mask to a flexible conductive film in a desired pattern;
    exposing the uncovered parts of the film to an etchant to form the conductive circuit;
    removing the solid ink mask by pulling the film over a bar to cause the ink mask to flake off of the conductive film, wherein the bar has a radius of curvature of about 0.1 mm to about 100 mm; and,
    abrading the solid ink mask with air jets, water or solvent fluid jets, spinning brushes or combinations thereof.

13. The process of claim 12, wherein the conductive film is poly(3,4-ethylenedioxythiophene-polystyrene sulfonate).

14. The process of claim 12, wherein the etchant is sodium hypochlorite.

15. The process of claim 12, further comprising removing residual ink by contacting the conductive film with at least one secondary roller carrying a solvent.

16. The process of claim 15, wherein the solvent is toluene.

* * * * *